(12) United States Patent
Yoshihara et al.

(10) Patent No.: US 9,673,128 B2
(45) Date of Patent: Jun. 6, 2017

(54) POWER MODULE AND FABRICATION METHOD FOR THE SAME

(71) Applicant: ROHM CO., LTD., Kyoto-shi, Kyoto (JP)

(72) Inventors: Katsuhiko Yoshihara, Kyoto (JP); Masao Saito, Kyoto (JP)

(73) Assignee: ROHM CO., LTD, Kyoto-Shi, Kyoto (JP)

( * ) Notice: Subject to any disclaimer, the term of this patent is extended or adjusted under 35 U.S.C. 154(b) by 0 days.

(21) Appl. No.: 15/003,199

(22) Filed: Jan. 21, 2016

(65) Prior Publication Data

US 2016/0141224 A1 May 19, 2016

Related U.S. Application Data

(63) Continuation of application No. PCT/JP2014/068980, filed on Jul. 17, 2014.

(30) Foreign Application Priority Data

Jul. 22, 2013 (JP) .................................. 2013-151690

(51) Int. Cl.
*H01L 23/29* (2006.01)
*H01L 23/42* (2006.01)
(Continued)

(52) U.S. Cl.
CPC .......... *H01L 23/42* (2013.01); *H01L 21/4842* (2013.01); *H01L 21/563* (2013.01);
(Continued)

(58) Field of Classification Search
CPC .......... H01L 2924/181; H01L 2224/97; H01L 33/56; H01L 2924/0665; H01L 31/048; H01L 31/0481; H01L 51/5253
(Continued)

(56) References Cited

U.S. PATENT DOCUMENTS 5,434,449 A    7/1995  Himeno et al.
5,646,445 A *  7/1997  Masumoto .............. H01L 23/24
                                               257/703

(Continued)

FOREIGN PATENT DOCUMENTS

JP         63-78558      4/1988
JP         05-218233    8/1993

(Continued)

OTHER PUBLICATIONS

International Search Report of PCT/JP2014/068980 and English language translation, dated Aug. 19, 2014, 4 pages total.

(Continued)

*Primary Examiner* — S. V. Clark
(74) *Attorney, Agent, or Firm* — Hamre, Schumann, Mueller & Larson, P.C.

(57) ABSTRACT

A power module includes: an insulating layer; a leadframe (metal layer) disposed on the insulating layer; a semiconductor chip disposed on the leadframe; and a mold resin formed so as to cover the semiconductor chip, at least a part of the metal layer, and at least a part of the insulating layer, wherein the insulating layer includes a relatively-soft insulating layer disposed at a side of the leadframe and a relatively-hard insulating layer disposed at an opposite side of the leadframes. Accordingly, there can be provided the power module with improved cooling capability and improved reliability, and the fabrication method for such a power module.

21 Claims, 15 Drawing Sheets

(51) Int. Cl.
| | |
|---|---|
| H01L 23/28 | (2006.01) |
| H01L 23/36 | (2006.01) |
| H01L 23/373 | (2006.01) |
| H01L 23/495 | (2006.01) |
| H01L 21/48 | (2006.01) |
| H01L 21/56 | (2006.01) |
| H01L 23/00 | (2006.01) |

(52) U.S. Cl.
CPC .............. *H01L 23/28* (2013.01); *H01L 23/36* (2013.01); *H01L 23/3737* (2013.01); *H01L 23/49551* (2013.01); *H01L 23/49562* (2013.01); *H01L 24/73* (2013.01); *H01L 2224/32245* (2013.01); *H01L 2224/45124* (2013.01); *H01L 2224/48091* (2013.01); *H01L 2224/48247* (2013.01); *H01L 2224/48472* (2013.01); *H01L 2224/73265* (2013.01); *H01L 2224/92247* (2013.01); *H01L 2924/1305* (2013.01); *H01L 2924/13055* (2013.01); *H01L 2924/13091* (2013.01); *H01L 2924/181* (2013.01)

(58) Field of Classification Search
USPC .................. 257/787, 790; 438/124, 125, 127
See application file for complete search history.

(56) References Cited

U.S. PATENT DOCUMENTS

| | | | | |
|---|---|---|---|---|
| 5,719,606 A | * | 2/1998 | Kigawa | ................ B41J 2/14209 347/50 |
| 5,904,506 A | * | 5/1999 | Yoneda | .............. G01R 31/2884 257/E21.504 |
| 7,391,101 B2 | * | 6/2008 | Takahata | ............. G01L 19/0084 257/672 |
| 2011/0180938 A1 | | 7/2011 | Hirasawa | |
| 2013/0011617 A1 | | 1/2013 | Tasaki | |

FOREIGN PATENT DOCUMENTS

| | | |
|---|---|---|
| JP | 10-93015 | 4/1998 |
| JP | 2000-31338 | 1/2000 |
| JP | 3201277 | 8/2001 |
| JP | 2002-76204 | 3/2002 |
| JP | 2005-109100 | 4/2005 |
| JP | 2007-81442 | 3/2007 |
| JP | 4023397 | 12/2007 |
| JP | 2008-244365 | 10/2008 |
| JP | 2008-263149 A | 10/2008 |
| JP | 2009-234112 | 10/2009 |
| JP | 2010-80611 A | 4/2010 |
| JP | 2012-243943 | 12/2012 |
| WO | 2013105351 | 7/2013 |

OTHER PUBLICATIONS

Supplementary European Search Report; European Patent Application No. 14829933.2, Feb. 3, 2017 (6 pages)

Japanese Official Action; Japanese Patent Application No. 2013-151690, Feb. 7, 2017 with machine translation (7 pages)

\* cited by examiner ized Gate Bipolar Transistor (IGBT) is mounted on a leadframe therein, and of which the whole system thereof is molded with resin. Since such a semiconductor device produces heat during an operating state, it is common to dispose a heat sink via an insulating layer on a back side surface of the leadframe in order to cool the semiconductor device.

POWER MODULE AND FABRICATION METHOD FOR THE SAME

CROSS REFERENCE TO RELATED APPLICATIONS

This is a continuation application (CA) of PCT Application No. PCT/JP2014/068980, filed on Jul. 17, 2014, which claims priority to Japan Patent Application No. P2013-151690 filed on Jul. 22, 2013 and is based upon and claims the benefit of priority from prior Japanese Patent Applications P2013-151690 filed on Jul. 22, 2013 and PCT Application No. PCT/JP2014/068980, filed on Jul. 17, 2014, the entire contents of each of which are incorporated herein by reference.

FIELD

The embodiment described herein relates to a power module and a fabrication method for such a power module.

BACKGROUND

Conventionally, there have been known power modules in which a power chip including a semiconductor device such as Insulated Gate Bipolar Transistor (IGBT) is mounted on a leadframe therein, and of which the whole system thereof is molded with resin. Since such a semiconductor device produces heat during an operating state, it is common to dispose a heat sink via an insulating layer on a back side surface of the leadframe in order to cool the semiconductor device.

When such a power module is attached to a cooling body, e.g. the heat sink in this way, a liquid thermal compound is coated to a metal surface (surface of a leadframe) facing (opposed to) the cooling body, and one surface or both surfaces of the cooling body facing (opposed to) the metal surface. Thus, a gap due to roughness, such as surface cracks etc. and a warpage can be filled up with the thermal compound.

SUMMARY

However, a thermal resistance of the thermal compound is larger and therefore becomes a cause of inhibiting a cooling effect of the power module. On the other hand, in the case where such a thermal compound is omitted, a gap is generated between the power module and the cooling body even if the power module is screwed into the cooling body in order to apply pressure thereon, and therefore a cooling effect will be further reduced as compared with the case where the thermal compound is coated thereon.

The embodiment provides a power module with improved cooling capability and improved reliability, and a fabrication method for such a power module.

According to one aspect of the embodiment, there is provided a power module comprising: an insulating layer; a metal layer disposed on the insulating layer; a semiconductor chip disposed on the metal layer; and a mold resin formed so as to cover the semiconductor chip, at least a part of the metal layer, and at least a part of the insulating layer, wherein the insulating layer includes a relatively-hard insulating layer disposed at a side of the metal layer and a relatively-soft insulating layer disposed at an opposite side of the metal layer.

According to another aspect of the embodiment, there is provided a fabrication method for a power module comprising: bonding a semiconductor chip to a leadframe with a conductive bonding material; electrically connecting the semiconductor chip and the leadframe to each other using a connecting member; disposing the leadframe on a metallic mold, and then forming a relatively-hard insulating layer so as to cover a bottom surface and a corner portion of the leadframe; after curing the relatively-hard insulating layer, forming a relatively-soft insulating layer on the bottom surface of the relatively-hard insulating layer; and after curing the relatively-soft insulating layer, closing the metallic mold, and then pouring a mold resin therein in order to mold the leadframe, the conductive bonding material, the semiconductor chip, and the connecting member.

According to still another aspect of the embodiment, there is provided a fabrication method for a power module comprising: bonding a semiconductor chip to a leadframe with a conductive bonding material; electrically connecting the semiconductor chip and the leadframe to each other using a connecting member; disposing the leadframe on a metallic mold, then closing the metallic mold, then pouring a mold resin therein, and then molding of the leadframe, the conductive bonding material, the semiconductor chip, and the connecting member so that a bottom surface of the mold resin and a bottom surface of the leadframe are flush with each other; forming a relatively-hard insulating layer on the surface of the mold resin and the surface of the leadframe which are flush with each other; and forming a relatively-soft insulating layer on a surface of the relatively-hard insulating layer.

According to the embodiment, there can be provided a power module with improved cooling capability and improved reliability, and a fabrication method for such a power module.

DESCRIPTION OF EMBODIMENTS

Figure 1:
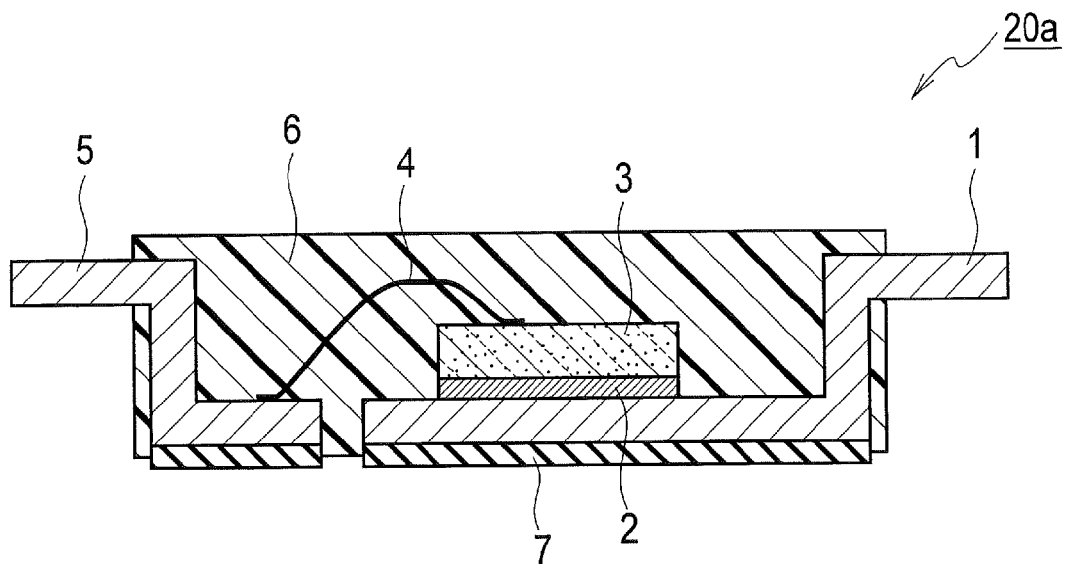
FIG. 1 is a schematic cross-sectional structure diagram of a power module according to a comparative example.

Next, a certain embodiment will be described with reference to drawings. In the description of the following drawings, the identical or similar reference numeral is attached to the identical or similar part. However, it should be noted that the drawings are schematic and the relation between thickness and the plane size and the ratio of the thickness of each component part differs from an actual thing. Therefore, detailed thickness and size should be determined in consideration of the following explanation. Of course, the part from which the relation and ratio of a mutual size differ also in mutually drawings is included.

Moreover, the embodiment described hereinafter merely exemplifies the device and method for materializing the technical idea; and the embodiment does not specify the material, shape, structure, placement, etc. of each component part as the following. The embodiment may be changed without departing from the spirit or scope of claims.

Comparative Example

A schematic cross-sectional structure of a power module 20a according to a comparative example is illustrated as shown in FIG. 1. As shown in FIG. 1, firstly, a semiconductor chip 3 is bonded with a solder 2 on a leadframe 1. Subsequently, the semiconductor chip 3 and a leadframe 5 are electrically connected to each other with an aluminum wire 4. Subsequently, the leadframe 1 and the leadframe 5 are disposed on a metallic mold (not shown), and an insulating layer 7 is formed on a surface of the leadframes 1 and 5 (hereafter referred to as a "bottom surface") opposite to a surface on which the semiconductor chip 3 is mounted. Subsequently, the metallic mold is closed and then a mold resin 6 is poured therein, and thereby the power module 20a molded with the mold resin 6 can be formed.

Figure 2:
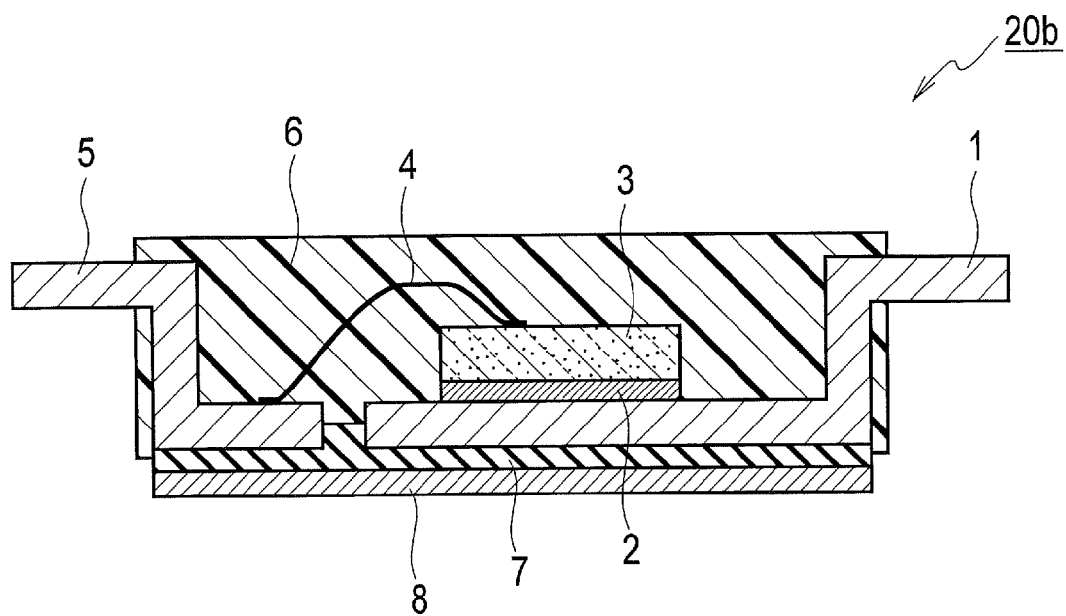
FIG. 2 is a schematic cross-sectional structure diagram of another power module according to the comparative example.

A schematic cross-sectional structure of another power module 20b according to the comparative example is illustrated as shown in FIG. 2. As shown in FIG. 2, there may be adopted a structure of bonding a metallic plate 8 on a bottom surface of the insulating layer 7. Thus, by disposing the metallic plate 8 on the outermost layer, the insulating layer 7 is covered with the metallic plate 8, and thereby it can prevent from an externally caused crack. The configuration of other portions is the same as that of the power module 20a.

Figure 3:
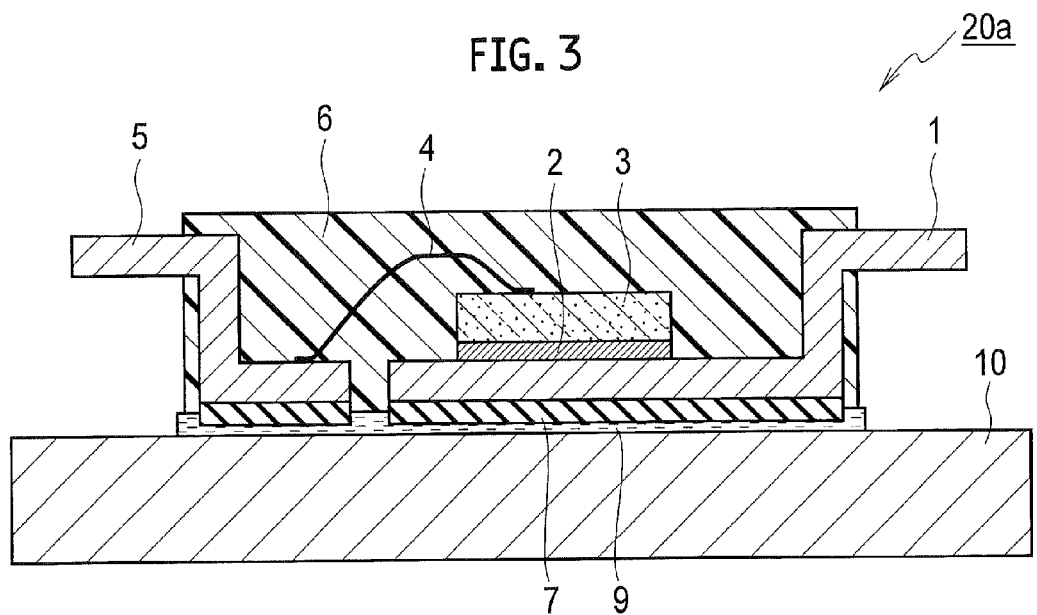
FIG. 3 is a schematic cross-sectional structure diagram showing a usage example of the power module shown in FIG. 1.
Figure 4:
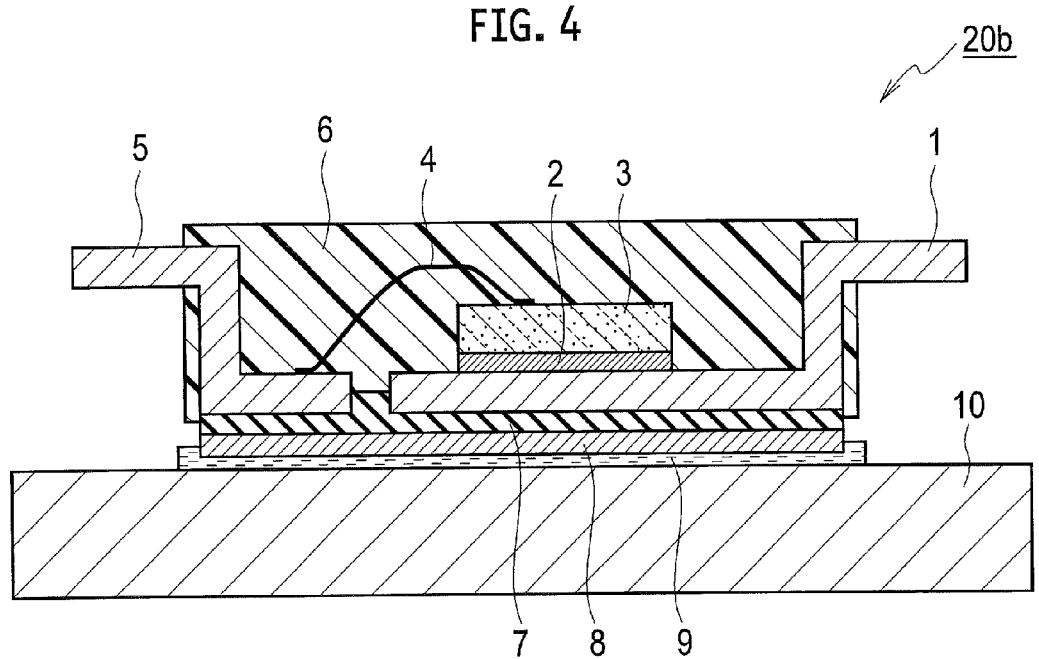
FIG. 4 is a schematic cross-sectional structure diagram showing a usage example of the power module shown in FIG. 2.

A schematic cross-sectional structure showing a usage example of the power module 20a shown in FIG. 1 is illustrated as shown in FIG. 3, and a schematic cross-sectional structure showing a usage example of the power module 20b shown in FIG. 2 is illustrated as shown in FIG. 4. As shown in FIGS. 3 and 4, the power modules 20a and 20b according to the comparative example are used by being screwed into a heat sink 10 via a liquid thermal compound 9.

However, a thermal resistance of the thermal compound 9 is larger and therefore becomes a cause of inhibiting a cooling effect of the power module. On the other hand, in the case where such a thermal compound 9 is omitted, a gap is generated between the power module and the heat sink 10 even if the power module is screwed into the cooling body in order to apply pressure thereon, and therefore a cooling effect will be further reduced as compared with the case where the thermal compound 9 is coated thereon.

Embodiment

Figure 5:
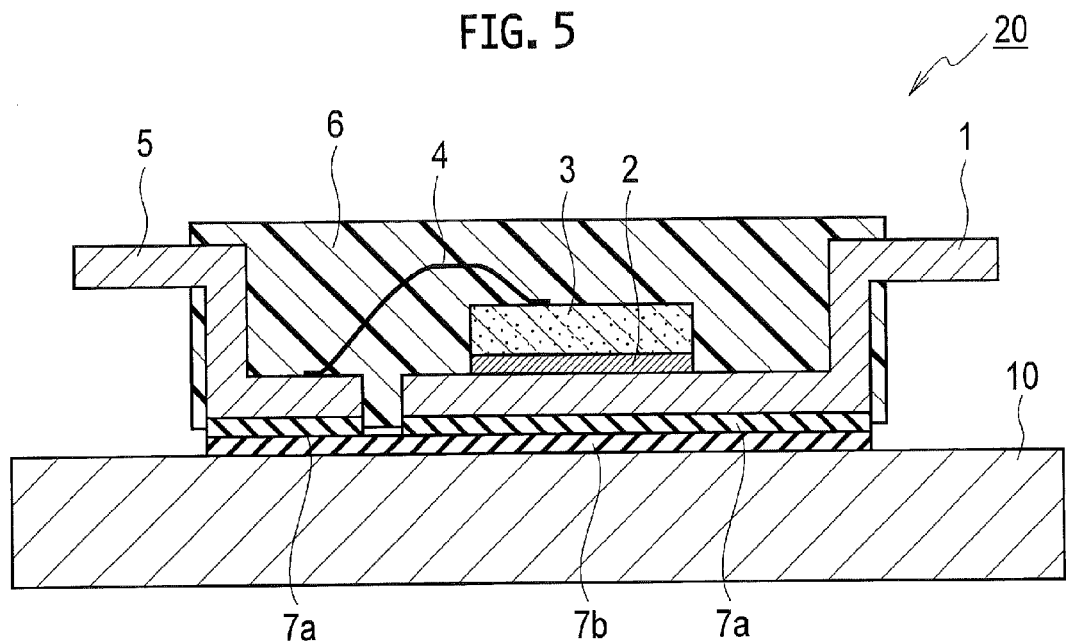
FIG. 5 is a schematic cross-sectional structure diagram of a power module according the embodiment.

As shown in FIG. 5, a power module 20 according to the embodiment includes: an insulating layer; leadframes (metal layers) 1, 5 respectively disposed on the insulating layer; and a semiconductor chip 3 disposed on the leadframe 1, wherein the insulating layer includes a relatively-hard insulating layer 7a disposed at a side of the leadframes 1, 5 and a relatively-soft insulating layer 7b disposed at an opposite side of the leadframes 1, 5.

More specifically, a heat sink (cooling body) 10 is provided, and the relatively-soft insulating layer 7b may be disposed at a side of the heat sink 10.

Moreover, a hardness of the relatively-soft insulating layer 7b may be softer than A40 in durometer hardness.

Moreover, the relatively-soft insulating layer 7b may be formed of an organic material(s).

Moreover, the relatively-soft insulating layer 7b may be formed of a silicone based resin(s).

Moreover, the relatively-soft insulating layer 7b may be filled up with a high thermally-conductive filler.

Moreover, the filler may be at least one selected from the group consist of aluminium oxide, silicon oxide, aluminum nitride, silicon nitride, boron nitride, beryllia, and magnesia.

Moreover, a hardness of the relatively-hard insulating layer 7a may be harder than A40 in durometer hardness.

Moreover, the relatively-hard insulating layer 7a may be formed of an organic material(s).

Moreover, the relatively-hard insulating layer 7a may be formed of at least one selected from the group consist of an epoxy based resin, an urethane system resin, an acrylic resin, and a silicone based resin.

Moreover, the relatively-hard insulating layer 7a may be filled up with a high thermally-conductive filler.

Moreover, the filler may be at least one selected from the group consist of aluminium oxide, silicon oxide, aluminum nitride, silicon nitride, boron nitride, beryllia, and magnesia.

Moreover, a groove 11 into which a part of the relatively-hard insulating layer 7a is inserted may be formed on a surface of the leadframes 1, 5 facing (opposed to) the relatively-hard insulating layer 7a.

Moreover, the relatively-soft insulating layer 7b and the relatively-hard insulating layer 7a may be formed before the semiconductor chip 3 is molded with a mold resin 6.

Moreover, an edge part of the relatively-soft insulating layer 7b and the relatively-hard insulating layer 7a may be intervened between the mold resin 6 and the leadframes 1, 5. Moreover, the relatively-soft insulating layer 7b and the relatively-hard insulating layer 7a may be formed after the semiconductor chip 3 is molded with a mold resin 6.

Moreover, the mold resin 6 and the leadframes 1, 5 may be formed so as to be flush with each other.

(Power Module)

Hereinafter, there will now be explained a configuration of the power module 20 according to the embodiment in more detail, with reference to FIG. 5. More specifically, a thermally conductive resin composed of an organic material (s) is coated to be cured on a surface facing (opposed to) the heat sink (cooling body) 10, in the power module 20 according to the embodiment. Subsequently, the power module 20 on which the thermally conductive resin is coated is fastened to the heat sink 10. At this time, in the embodiment, the gap-filling thermal compound 9 does not coat between the insulating layer 7 and the heat sink 10 as in the case of the comparative example. More specifically, in the embodiment, a thermally conductive resin (the relatively-hard insulating layer 7a) harder equal to or greater than A40 in durometer hardness is used so as to prevent the surfaces from being scratched at the time of handling of the power module.

Resistance to such scratches can be increased by using such a relatively-hard insulating layer 7a. On the other hand, due to the higher hardness of the relatively-hard insulating layer 7a, the relatively-hard insulating layer 7a cannot be inserted into a gap due to the scratches or warpage made on the surface of the heat sink 10, and therefore the thermal resistance may be increased.

Consequently, a flexible resin (the relatively-soft insulating layer 7b) is further coated on the surface of the relatively-hard insulating layer 7a. Accordingly, since the flexible relatively-soft insulating layer 7b can be inserted into a gap due to the scratches or warpage made on the surface of the heat sink 10, the thermal resistance is hardly increased. The scratch may be made on the surface of the relatively-soft insulating layer 7b due to the higher flexibility thereof, but insulation performance is hardly decreased because the relatively-hard insulating layer 7a is formed as underlying.

As a material(s) of the relatively-hard insulating layer 7a, an epoxy based resin, an urethane system resin, an acrylic resin, a silicone based resin, etc. can be used. Moreover, the resin used for the relatively-hard insulating layer 7a is filled up with a high thermally-conductive filler. As such a filler, aluminium oxide, silicon oxide, aluminum nitride, silicon nitride, boron nitride, beryllia, magnesia, etc. can be used. In addition, as a material (s) of the relatively-hard insulating layer 7a, diamond, diamond like carbon (DLC), graphite, etc. may be used.

A silicone based resin etc. can be used as a material(s) of the relatively-soft insulating layer 7b. Such a silicone based resin is also filled up with a high thermally-conductive filler. As such a filler, aluminium oxide, silicon oxide, aluminum nitride, silicon nitride, boron nitride, beryllia, magnesia, etc. can also be used.

The conventional thermal compound 9 is a silicone based compound, and its coefficient of thermal conductivity was approximately 1 W/mK. On the other hand, since the high thermally-conductive resin of an approximately 1 to 20 W/mK, for example, is coated instead of the thermal compound 9 on the power module 20 according to the embodiment, it is possible to reduce the thermal resistance, improve the cooling capability, and improve also the reliability.

(Usage Example)

Figure 6:
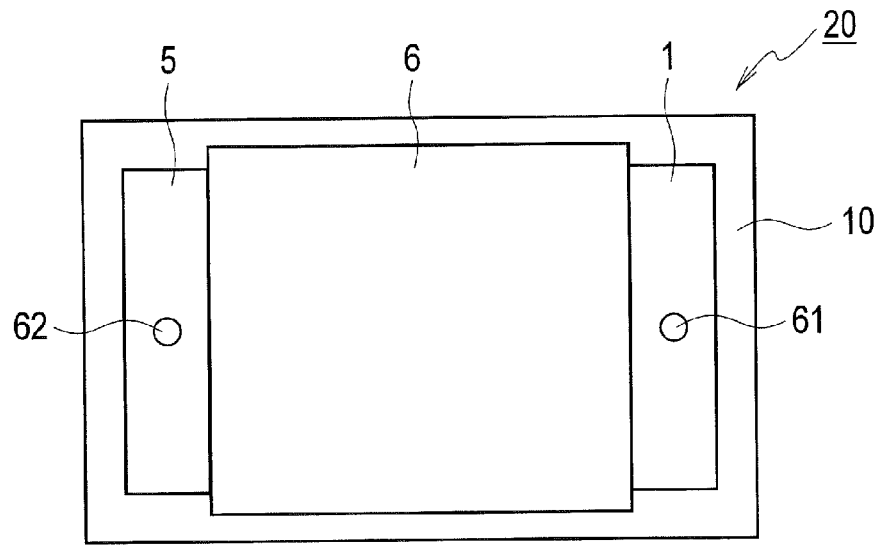
FIG. 6 is a schematic planar structure Fig. showing a usage example of the power module according to the embodiment.

A schematic planar structure showing a usage example of the power module 20 according to the embodiment is illustrated as shown in FIG. 6. As shown in FIG. 6, the leadframes 1, 5 are respectively screwed into the heat sink 10 with screws 61, 62. Needless to say, a position to be screwed or the number of the screws can be appropriately modified. According to such a configuration, even if a flexible resin is used for the relatively-soft insulating layer 7b, the power module 20 is strongly joined to the heat sink 10.

(Fabrication Method 1)

A process showing a fabrication method of the power module 20 according to the embodiment is illustrated as shown in FIG. 7. Although only a portion at the side of the leadframe 1 is shown in FIG. 7, other portions are as being shown in FIG. 5.

Figure 7A:
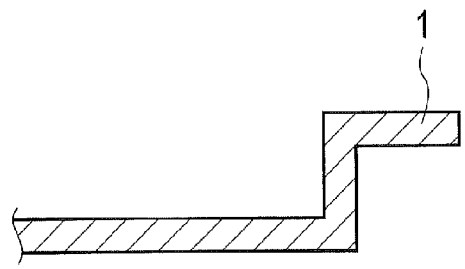
FIG. 7A is a cross-sectional diagram showing a state before bonding a semiconductor chip thereto, in a process chart showing a fabrication method of the power module according to the embodiment.
Figure 7D:
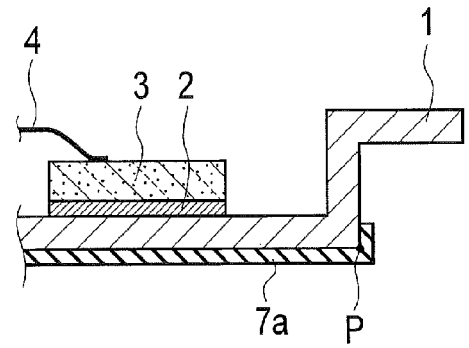
FIG. 7D is a cross-sectional diagram showing a state where a relatively-hard insulating layer is formed thereon, in the process chart showing the fabrication method of the power module according to the embodiment.
Figure 7B:
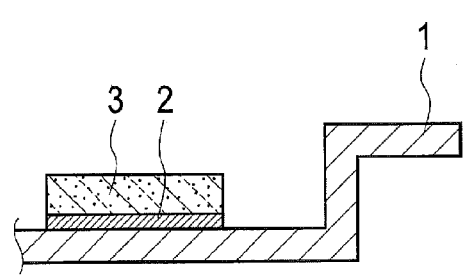
FIG. 7B is a cross-sectional diagram showing a state after bonding a semiconductor chip thereto, in a process chart showing the fabrication method of the power module according to the embodiment.

Firstly, as shown in FIGS. 7A and 7B, is used for, the semiconductor chip 3 is bonded with the solder 2 to the leadframe formed of Cu, AL(s), or an alloy thereof. A high thermally-conductive silver paste may be used as the solder layer 2.

Figure 7E:
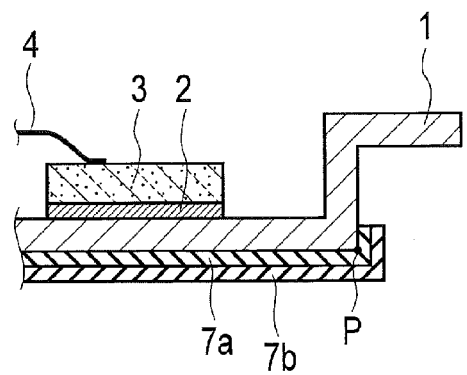
FIG. 7E is a cross-sectional diagram showing a state where a relatively-soft insulating layer is formed thereon, in the process chart showing the fabrication method of the power module according to the embodiment.
Figure 7C:
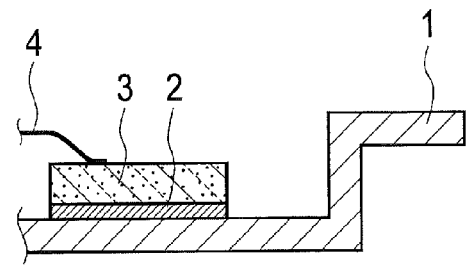
FIG. 7C is a cross-sectional diagram showing a state where an aluminum wire is connected thereto, in the process chart showing the fabrication method of the power module according to the embodiment.

Next, as shown in FIG. 7C, in order to electrically connect the semiconductor chip 3 to the leadframe 5, ultrasonic bonding is applied thereto using the aluminum wire 4. In this case, the leadframe 1 and the leadframe 5 are connected to each other with a connector bar (not shown) in order to prevent from relative positions thereof being displaced from each other at the time of the ultrasonic bonding. The connector bar will be removed after the ultrasonic bonding is completed.

Next, as shown in FIG. 7D, the leadframe 1 and the leadframe 5 are disposed on a metallic mold (not shown), and then the relatively-hard insulating layer 7a is formed on the bottom surfaces of the leadframes 1 and 5. The thickness of the relatively-hard insulating layer 7a is approximately 0.5 mm. Screen printing etc. may be suitable as a fabrication method of the relatively-hard insulating layer 7a. At this time, the relatively-hard insulating layer 7a is formed so as to cover a corner portion P of the leadframes 1, 5.

Next, after curing the relatively-hard insulating layer 7a, the relatively-soft insulating layer 7b is formed on the surface of the relatively-hard insulating layer 7a, as shown in FIG. 7E. The thickness of the relatively-soft insulating layer 7b is approximately 0.5 mm. Screen printing etc. may also be suitable as a fabrication method of the relatively-soft insulating layer 7b. Also at this time, the relatively-soft insulating layer 7b is formed so as to cover a corner portion P of the leadframes 1, 5.

Figure 7F:
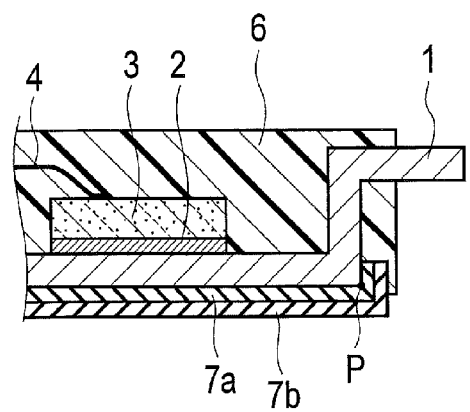
FIG. 7F is a cross-sectional diagram showing a state where the power module is molded, in the process chart showing the fabrication method of the power module according to the embodiment.

Finally, after curing the relatively-soft insulating layer 7b, the metallic mold is closed, and then the mold resin 6 is poured therein in order to mold the leadframe 1, the solder 2, the semiconductor chip 3, the aluminum wire 4, and the leadframe 5, as shown in FIG. 7F. Thereby, the power module 20 molded with the mold resin 6 can be fabricated.

According to such a fabrication method, an edge part of the relatively-hard insulating layer 7a, and an edge part of the relatively-soft insulating layer 7b are intervened between the mold resin 6 and the leadframes 1, 5. Accordingly, a possibility of short-circuiting at the corner portion P of the leadframes 1, 5 can be reduced.

(Fabrication Method 2)

A process showing another fabrication method of the power module 20 according to the embodiment is illustrated as shown in FIG. 8. A different point from the fabrication method 1 (FIG. 7) is a point that the order of the process of molding and the process of forming the relatively-hard insulating layer 7a and the relatively-soft insulating layer 7b are reversed.

Figure 8A:
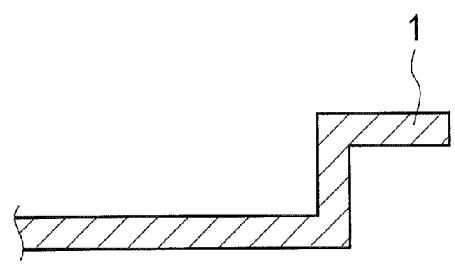
FIG. 8A is a cross-sectional diagram showing a state before bonding the semiconductor chip thereto, in a process chart showing another fabrication method of the power module according to the embodiment.
Figure 8D:
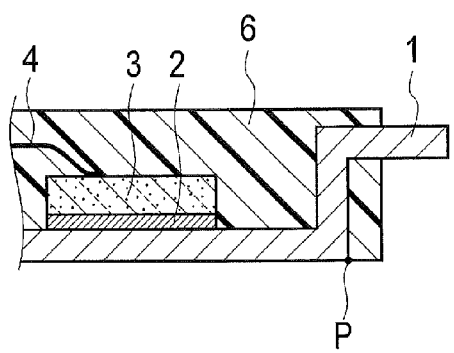
FIG. 8D is a cross-sectional diagram showing a state where the power module is molded, in the process chart showing another fabrication method of the power module according to the embodiment.
Figure 8B:
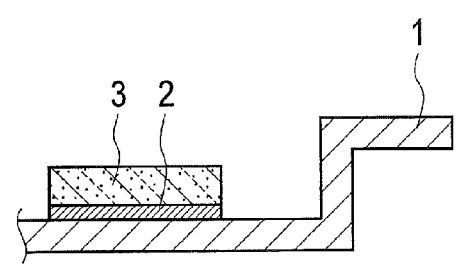
FIG. 8B is a cross-sectional diagram showing a state after bonding a semiconductor chip thereto, in a process chart showing another fabrication method of the power module according to the embodiment.
Figure 8E:
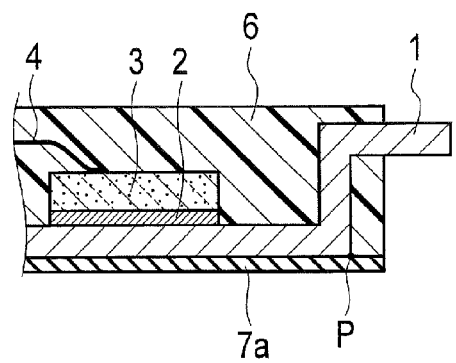
FIG. 8E is a cross-sectional diagram showing a state where a relatively-hard insulating layer is formed thereon, in the process chart showing another fabrication method of the power module according to the embodiment.
Figure 8C:
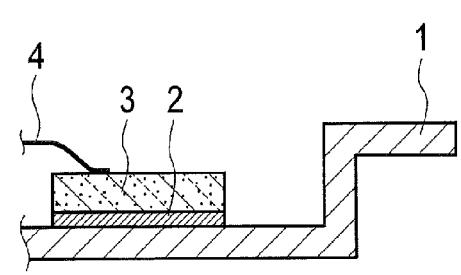
FIG. 8C is a cross-sectional diagram showing a state where an aluminum wire is connected thereto, in the process chart showing another fabrication method of the power module according to the embodiment.
Figure 8F:
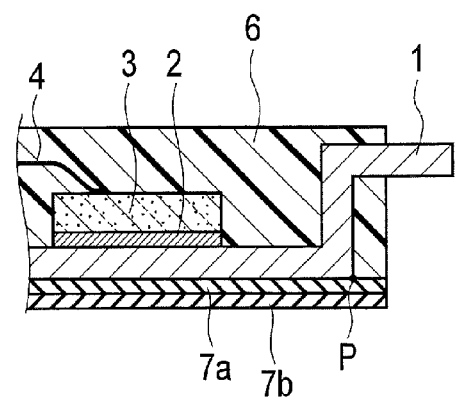
FIG. 8F is a cross-sectional diagram showing a state where a relatively-soft insulating layer is formed thereon, in the process chart showing another fabrication method of the power module according to the embodiment.
Figure 9A:
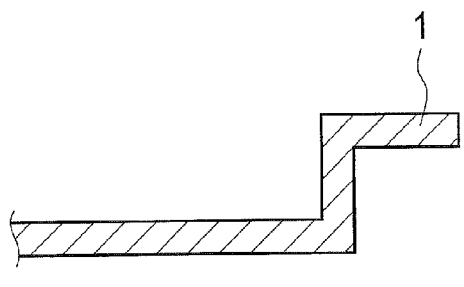
FIG. 9A is a cross-sectional diagram showing a state before bonding the semiconductor chip thereto, in a process chart showing still another fabrication method of the power module according to the embodiment.
Figure 9B:
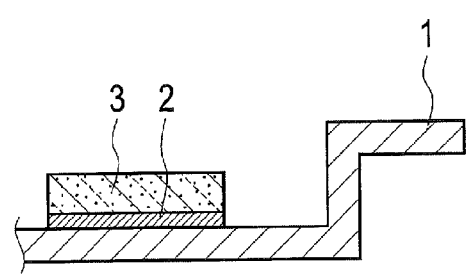
FIG. 9B is a cross-sectional diagram showing a state after bonding a semiconductor chip thereto, in a process chart showing still another fabrication method of the power module according to the embodiment.
Figure 9C:
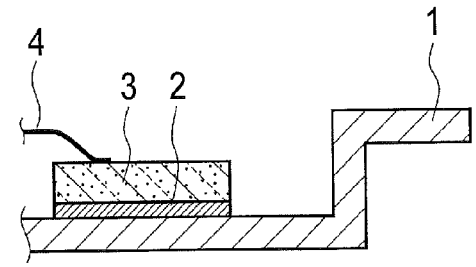
FIG. 9C is a cross-sectional diagram showing a state where an aluminum wire is connected thereto, in the process chart showing still another fabrication method of the power module according to the embodiment.
Figure 9D:
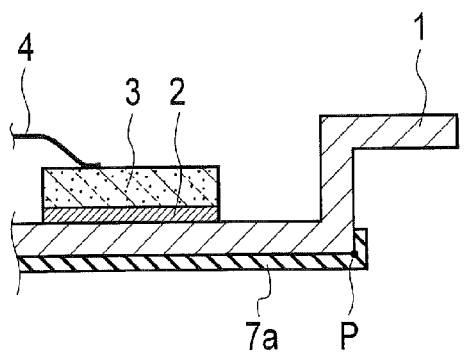
FIG. 9D is a cross-sectional diagram showing a state where a relatively-hard insulating layer is formed thereon, in the process chart showing still another fabrication method of the power module according to the embodiment.
Figure 9E:
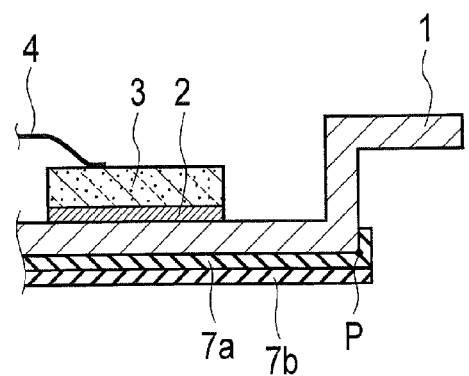
FIG. 9E is a cross-sectional diagram showing a state where a relatively-soft insulating layer is formed thereon, in the process chart showing still another fabrication method of the power module according to the embodiment.
Figure 9F:
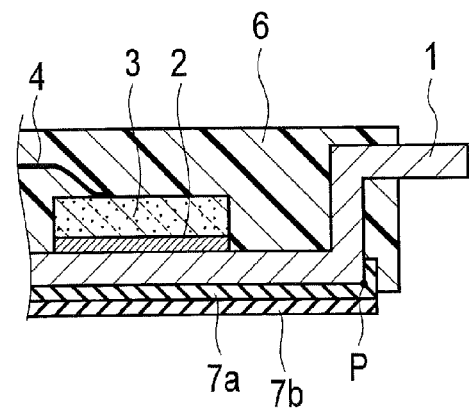
FIG. 9F is a cross-sectional diagram showing a state where the power module is molded, in the process chart showing still another fabrication method of the power module according to the embodiment.
Figure 10A:
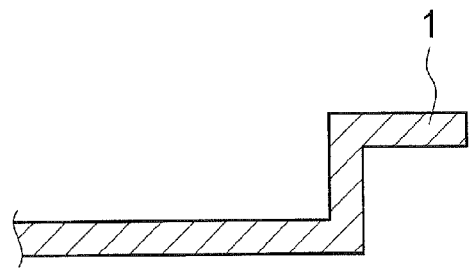
FIG. 10A is a cross-sectional diagram showing a state before bonding the semiconductor chip thereto, in a process chart showing yet another fabrication method of the power module according to the embodiment.
Figure 10B:
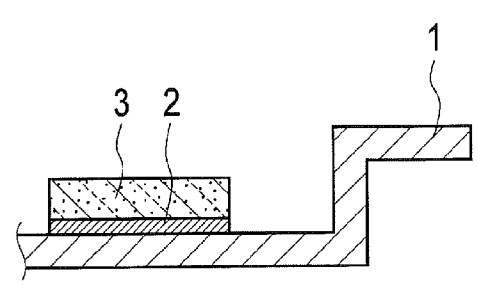
FIG. 10B is a cross-sectional diagram showing a state after bonding a semiconductor chip thereto, in a process chart showing yet another fabrication method of the power module according to the embodiment.
Figure 10C:
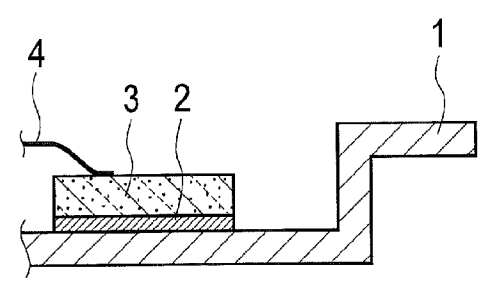
FIG. 10C is a cross-sectional diagram showing a state where an aluminum wire is connected thereto, in the process chart showing yet another fabrication method of the power module according to the embodiment.
Figure 10D:
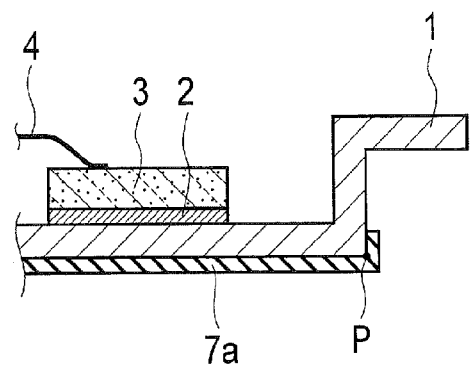
FIG. 10D is a cross-sectional diagram showing a state where a relatively-hard insulating layer is formed thereon, in the process chart showing yet another fabrication method of the power module according to the embodiment.
Figure 10E:
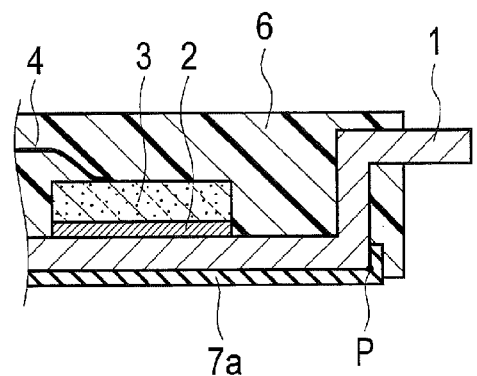
FIG. 10E is a cross-sectional diagram showing a state where the power module is molded, in the process chart showing yet another fabrication method of the power module according to the embodiment.
Figure 10F:
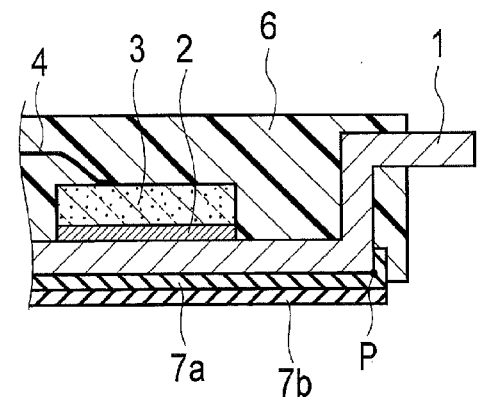
FIG. 10F is a cross-sectional diagram showing a state where a relatively-soft insulating layer is formed thereon, in the process chart showing yet another fabrication method of the power module according to the embodiment.

The respective processes of FIGS. 8A to 8C are the same as the respective processes of FIGS. 7A to 7C. More specifically, the semiconductor chip 3 is bonded to the leadframe 1, and then the semiconductor chip 3 and the leadframe 5 are connected to each other with the aluminum wire 4. In this step, the metallic mold is closed and then the mold resin 6 is poured therein, as shown in FIG. 8D. The mold resin 6 and the leadframe 1 are formed so as to be flush with each other at the corner portion P, at this time. Next, as shown in FIG. 8E, the relatively-hard insulating layer 7a is formed on the surface of the mold resin 6 and the surface of the leadframes 1, 5 which are flush with each other. Finally, as shown in FIG. 8F, the relatively-soft insulating layer 7b is formed on the surface of the relatively-hard insulating layer 7a. According to such a fabrication method, the corner portion P of the leadframes 1, 5 is covered with the relatively-hard insulating layer 7a and the relatively-soft insulating layer 7b, and thereby a possibility of short-circuiting at the corner portion P can also be reduced.

(Fabrication Method 3)

A process showing still another fabrication method of the power module 20 according to the embodiment is illustrated as shown in FIG. 9. A different point from the fabrication method 1 (FIG. 7) is only a region for forming the relatively-soft insulating layer 7b. More specifically, as shown in FIG. 9E, the relatively-soft insulating layer 7b is formed only on a bottom surface of the relatively-hard insulating layer 7a. According to such a fabrication method, the corner portion P of the leadframes 1, 5 is covered with the relatively-hard insulating layer 7a, and thereby a possibility of short-circuiting at the corner portion P can also be reduced.

(Fabrication Method 4)

A process showing yet another fabrication method of the power module 20 according to the embodiment is illustrated as shown in FIG. 10. A different point from the fabrication method 3 (FIG. 9) is a point that the order of the process of molding and the process of forming the relatively-soft insulating layer 7b are reversed. A reason that these processes can be reversed is as explained in the fabrication method 2 (FIG. 8). According to such a fabrication method, the corner portion P of the leadframes 1, 5 is covered with the relatively-hard insulating layer 7a, and thereby a possibility of short-circuiting at the corner portion P can also be reduced.

(Modified Example of Power Module)

Figure 11:
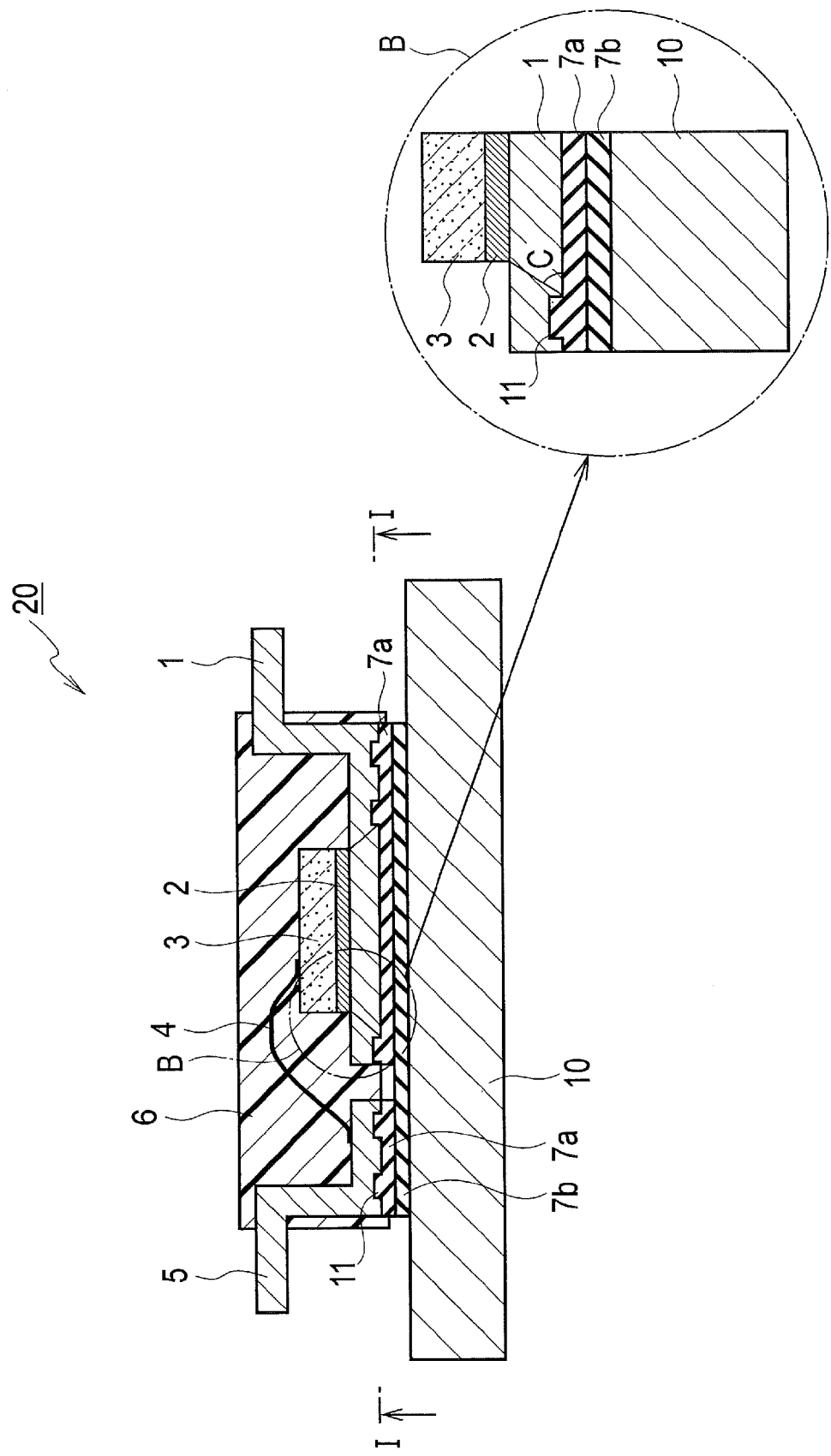
FIG. 11 is a schematic cross-sectional structure diagram showing a modified example of the power module according to the embodiment.

A schematic cross-sectional structure showing a modified example of the power module according to the embodiment is illustrated as shown in FIG. 11. As shown in FIG. 11, a groove 11 into which a part of the relatively-hard insulating layer 7a is inserted may be formed on a surface of the leadframes 1, 5 facing (opposed to) the relatively-hard insulating layer 7a. Thus, since the relatively-hard insulating layer 7a is tightly insert in the groove 11 according to such configuration, the relatively-hard insulating layer 7a can be strongly bonded to the leadframes 1 and 5 without increasing the thermal resistance (anchor effect).

As shown in the principal part B in FIG. 11, the groove 11 is formed outside a region extended in downward direction by only the angle C from a bottom head of the solder 2. Since a heat generated from the semiconductor chip 3 is conducted by being spread at approximately 45 degrees, it is preferable to set the angle C to be equal to or less than 45 degrees. Accordingly, since no groove 11 is formed in a region to which the heat is conducted, a defect due to increase of the thermal resistance can be avoided.

Figure 12:
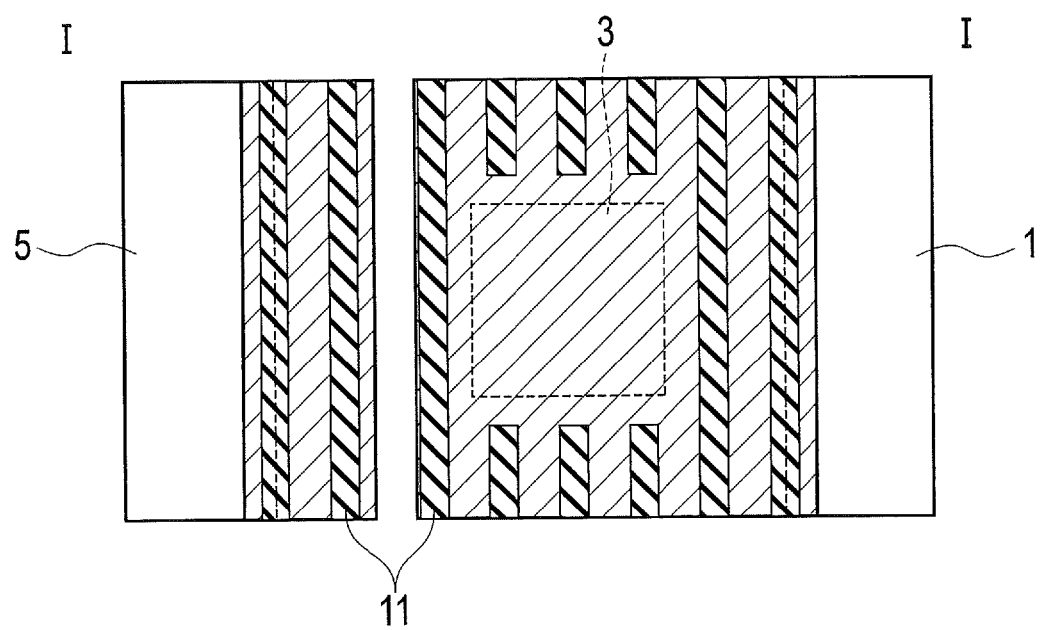
FIG. 12 is a schematic cross-sectional structure diagram taken in the line I-I of FIG. 11.

Another schematic cross-sectional structure taken in the line I-I shown in FIG. 11 is illustrated as shown in FIG. 12. In the embodiment, the case where a plurality of the grooves 11 are formed in a long-side direction (horizontal direction) of the power module 20 is exemplified. The cross-sectional shape of the groove 11 is a rectangle shape (refer to FIG. 11). Needless to say, a cross-sectional shape, and other details configuration of the groove 11 can be modified as appropriately.

As mentioned above, the power module 20 according to the embodiment is a resin-sealed semiconductor module having a vertical structure of the semiconductor chip/the metal layer/the insulating layer. The relatively-hard insulating layer 7a and the relatively-soft insulating layer 7b are laminated as an insulating layer in such a vertical structure. Thus, between the heat sink 10 and the module is tightly filled up with the softness relatively-soft insulating layer 7b. Accordingly, the thermal compound 9 becomes unnecessary, and therefore it becomes possible to provide the power module of which the cooling effect is hardly inhibited. Moreover, since it becomes unnecessary to coat the liquid thermal compound 9 at a user side, it becomes easy to treat the power module. Furthermore, the scratch may be made on the surface of the relatively-soft insulating layer 7b due to the higher flexibility thereof, but insulation performance is hardly decreased because the relatively-hard insulating layer 7a is formed as underlying.

Although the structure where the relatively-hard insulating layer 7a and the relatively-soft insulating layer 7b are laminated is exemplified in the embodiment, at least two insulating layers are merely required therefor. More specifically, a similar effect can be produced if at least both of the relatively-hard insulating layer 7a and the relatively-soft insulating layer 7b are included also in the case of a three or more layered structure.

(Examples of Module)

Hereinafter, there will now be explained examples of the power module 20 according to the embodiment. Needless to say, also in the power module 20 explained below, the relatively-hard insulating layer 7a and the relatively-soft insulating layer 7b can also be laminated thereon as an insulating layer. A material(s), a shape, etc. of the insulating layers, and other details configuration thereof are the same as described above.

Figure 13:
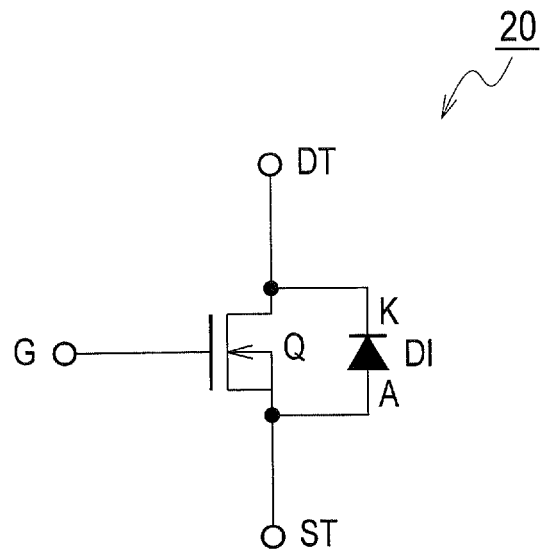
FIG. 13 is a schematic circuit representative diagram showing a 1-in-1 module, which is the power module according to the embodiment.

FIG. 13 illustrates a schematic circuit representative of a one-in-one (1-in-1) module, which is the power module 20 according to the embodiment. Moreover, FIG. 14 illustrates a detail circuit representative of the 1-in-1 module, which is the power module 20 according to the embodiment.

The power module 20 according to the embodiment includes a configuration of 1-in-1 module. More specifically, one MOSFETQ is included in one module. As an example, five chips (MOS transistor×5) can be mounted thereon, and a maximum of five pieces of the MOSFETs respectively can be connected to one another in parallel. Note that it is also possible to mount a part of five pieces of the chips for the diode DI thereon.

The diode DI connected to the MOSFETQ inversely in parallel is shown in FIG. 13. A main electrode of the MOSFETQ is expressed with a drain terminal DT and a source terminal ST.

Figure 14:
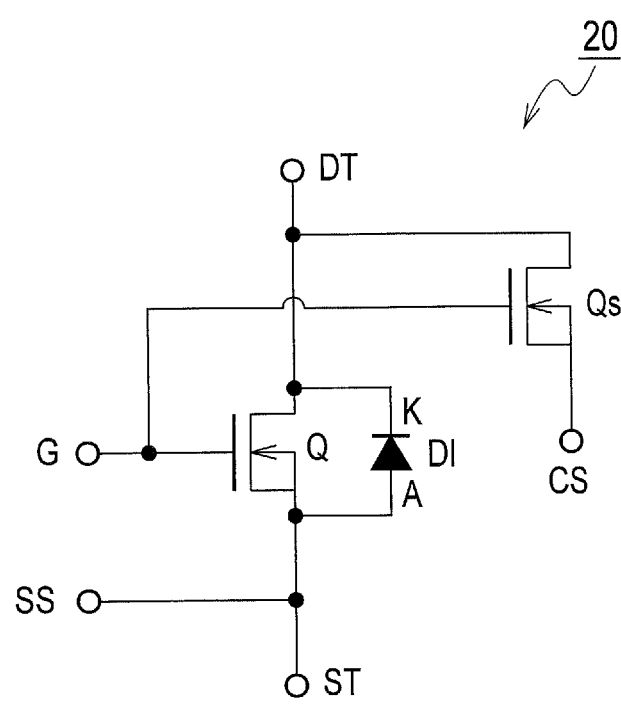
FIG. 14 is a detail circuit representative diagram showing the 1-in-1 module, which is the power module according to the embodiment.

More particularly, as shown in FIG. 14, a sense MOSFET Qs is connected to the MOSFETQ in parallel. The sense MOSFET Qs is formed as a minuteness transistor in the same chip as the MOSFET Q. n FIG. 14, reference numeral SS denotes a source sense terminal, reference numeral CS denotes a current sense terminal, and reference numeral G denotes a gate signal terminal. Note that, also in the semiconductor device Q according to the embodiment, the sense MOSFET Qs is formed as a minuteness transistor in the same chip.

Figure 15:
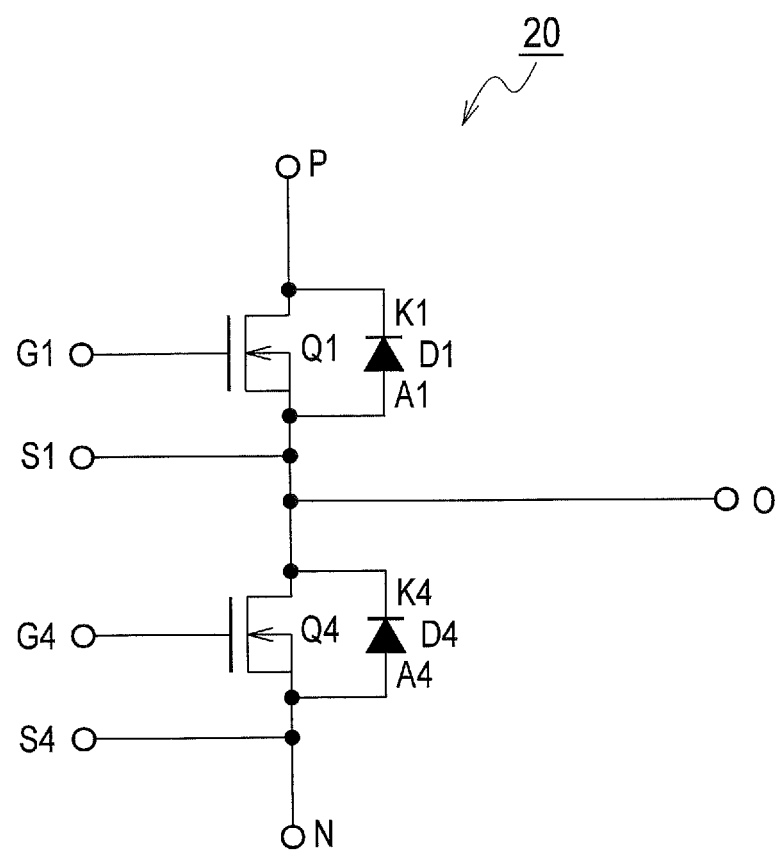
FIG. 15 is a schematic circuit representative diagram showing a 2-in-1 module, which is the power module according to the embodiment.

Moreover, FIG. 15 illustrates a schematic circuit representative of a 2-in-1 module, which is the power module 20 according to the embodiment. As shown in FIG. 15, two MOSFETs Q1, Q4 are included in one module. Reference numeral G1 denotes a gate signal terminal of the MOSFET Q1, and reference numeral S1 denotes a source sense terminal of the MOSFET Q1. Reference numeral G4 denotes a gate signal terminal of the MOSFET Q4, and reference numeral S4 denotes a source sense terminal of the MOSFET Q4. Reference numeral P denotes a positive side power input terminal, reference numeral N denotes a negative side power input terminal, and reference numeral O denotes an output terminal.

(Configuration Example of Semiconductor Device)

Figure 16:
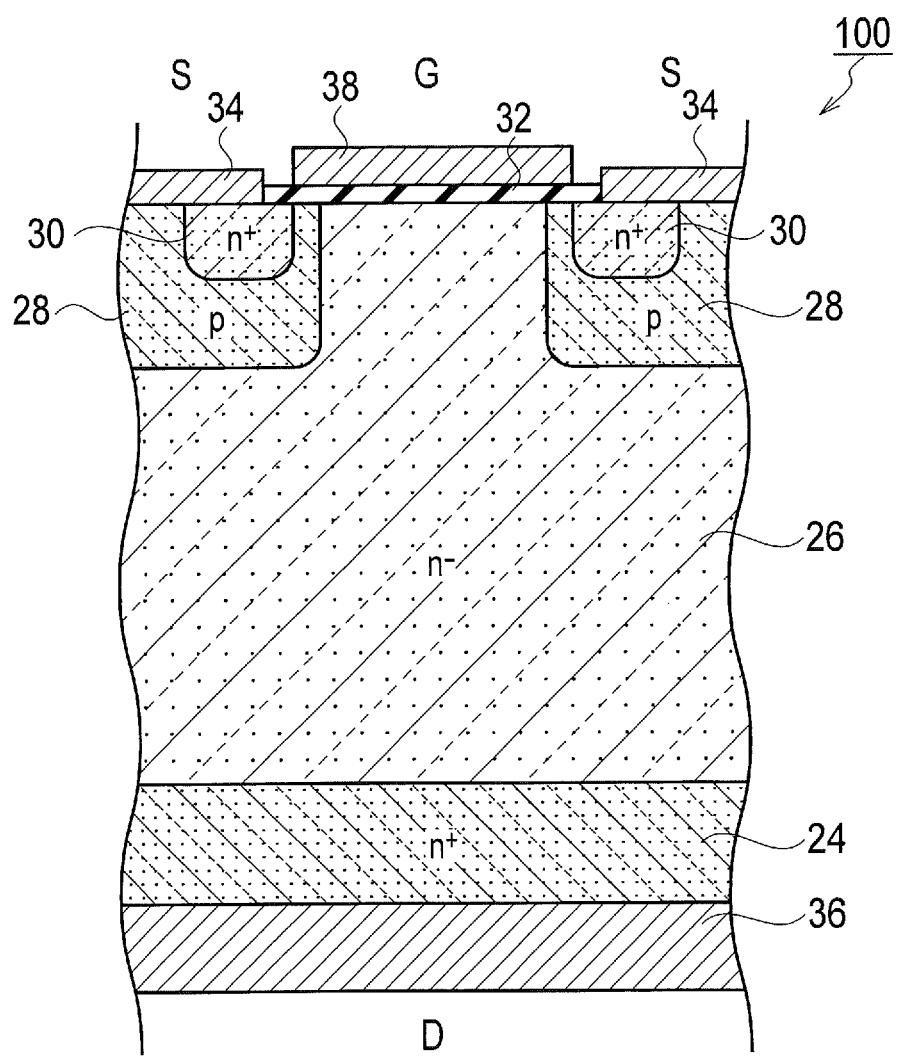
FIG. 16 is a schematic cross-sectional structure diagram showing an SiC MOSFET, which is an example of a semiconductor device applied to the power module according to the embodiment.

As shown in FIG. 16, a schematic cross-sectional structure of the SiC MOSFET as an example of the semiconductor device 100 (Q) applied to the power module 20 according to the embodiment includes: a semiconductor substrate 26 composed of an $n^-$ type high resistivity layer; a p type base region 28 formed on the surface side of the semiconductor substrate 26; source regions 30 formed on the surface of the p type base regions 28; a gate insulating film 32 disposed on the surface of the semiconductor substrate 26 between the p type base regions 28; a gate electrode 38 disposed on the gate insulating film 32; a source electrode 34 connected to the source region 30 and the p type base region 28; an $n^+$ drain region 24 disposed on a back side surface opposite to the surface of the semiconductor substrate 26; and a drain pad electrode 36 connected to the $n^+$ drain region 24.

In FIG. 16, although the semiconductor device 100 is composed of a planar-gate-type n channel vertical SiC-MOSFET, the semiconductor device 100 may be composed of a trench-gate-type n channel vertical SiC-MOSFET, etc.

Moreover, a GaN based FET etc. instead of SiC MOSFET are also applicable to the semiconductor device 100 (Q) applied to the power module 20 according to the embodiment.

Any one of an SiC based power device, a GaN based power device, and an AlN based power device is applicable to the semiconductor device 100 applied to the power module 20 according to the embodiment.

Furthermore, a semiconductor of which the bandgap energy is from 1.1 eV to 8 eV, for example, can be used for the semiconductor device 100 applied to the power module 20 according to the embodiment.

Figure 17:
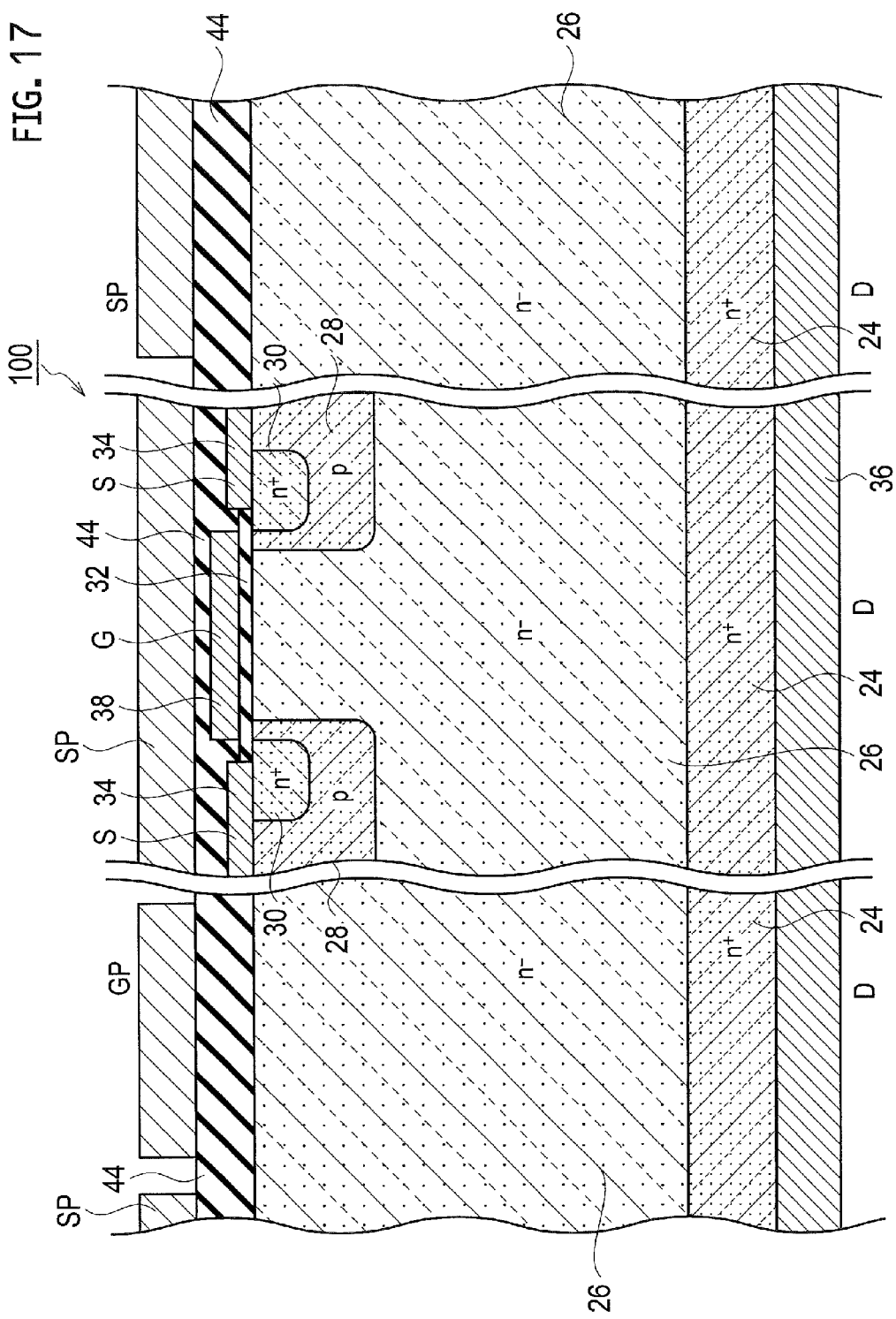
FIG. 17 is a schematic cross-sectional structure diagram showing an SiC MOSFET including a source pad electrode SP and a gate pad electrode GP, which is an example of the semiconductor device applied to the power module according to the embodiment.

FIG. 17 illustrates a schematic cross-sectional structure of an SiC MOSFET including a source pad electrode SP and a gate pad electrode GP, which is an example of the semiconductor device 100 applied to the power module 20 according to the embodiment. The gate pad electrode GP is connected to the gate electrode 38 disposed on the gate insulating film 32, and the source pad electrode SP is connected to the source electrode 34 connected to the source region 30 and the p type base region 28.

Moreover, as shown in FIG. 17, the gate pad electrode GP and the source pad electrode SP are disposed on an interlayer insulating film 44 for passivation which covers the surface of the semiconductor device 100. Microstructural transistor structure may be formed in the semiconductor substrate 26 below the gate pad electrode GP and the source pad electrode in the same manner as the center portion shown in FIG. 16 or 17.

Furthermore, as shown in FIG. 17, the source pad electrode SP may be disposed to be extended onto the interlayer insulating film 44 for passivation, also in the transistor structure of the center portion.

Figure 18:
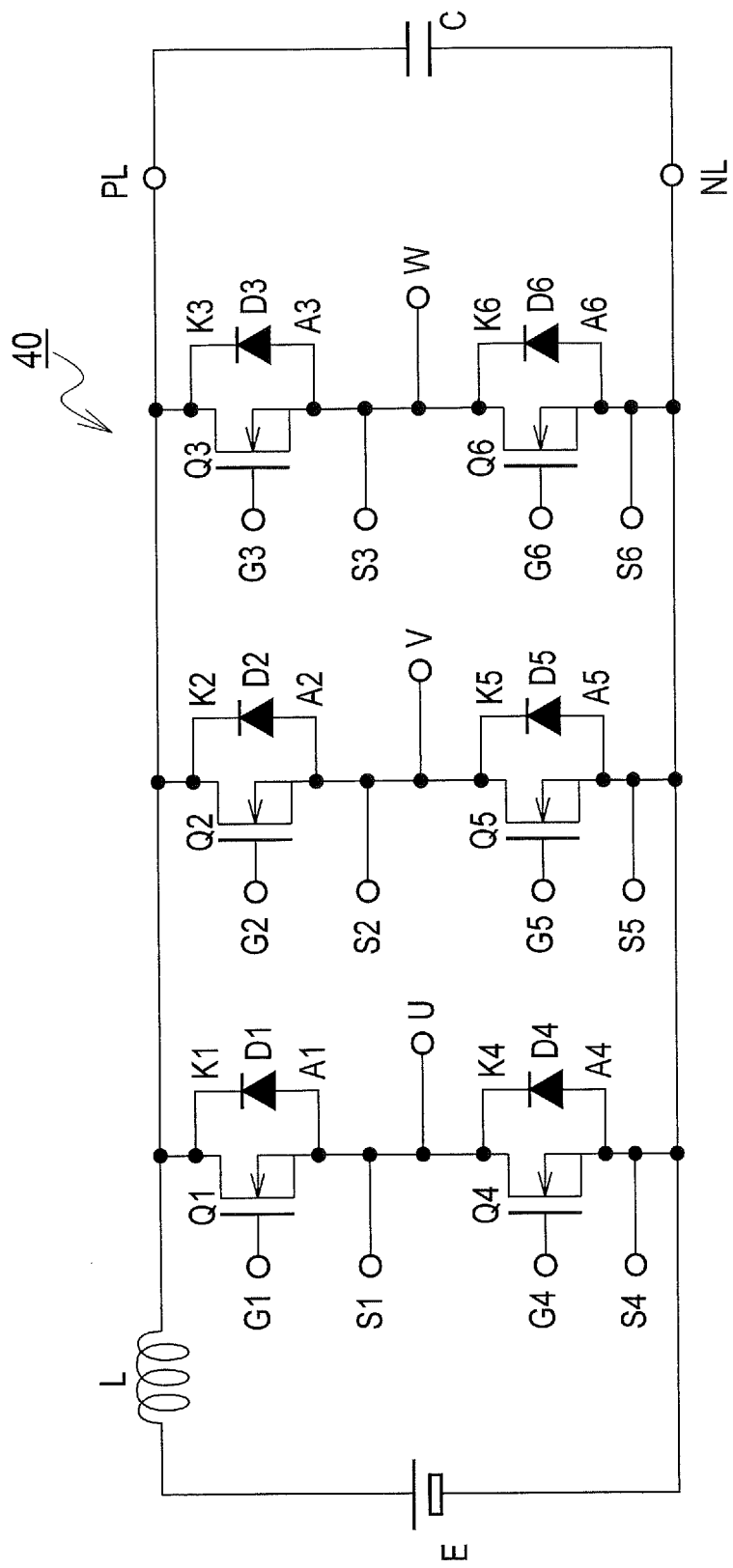
FIG. 18 shows an example of a circuit configuration in which a snubber capacitor is connected between a power terminal PL and an earth terminal (ground terminal) NL, in a schematic circuit configuration of a three-phase alternating current (AC) inverter composed using the power module according to the embodiment.

In the power module 20 according to the embodiment, FIG. 18 illustrates a circuit configuration to connect the snubber capacitor C between the power terminal PL and the earth terminal (ground terminal) NL. When connecting the power module 20 according to the embodiment to the power source E, large surge voltage Ldi/dt is produced by an inductance L included in a connection line due to a high switching speed of the SiC device. For example, the surge voltage Ldi/dt is expressed as follows: Ldi/dt=$3\times10^9$ (A/s), where a current change di=300 A, and a time variation accompanying switching dt=100 ns. Although a value of the surge voltage Ldi/dt changes dependent on a value of the inductance L, the surge voltage Ldi/dt is superimposed on the power source V. Such a surge voltage Ldi/dt can be absorbed by the snubber capacitor C connected between the power terminal PL and the earth terminal (ground terminal) NL.

(Application Examples for Applying Power Module)

Next, there will now be explained a three-phase AC inverter 40 composed by using the power module 20 according to the embodiment with reference to FIG. 19.

Figure 19:
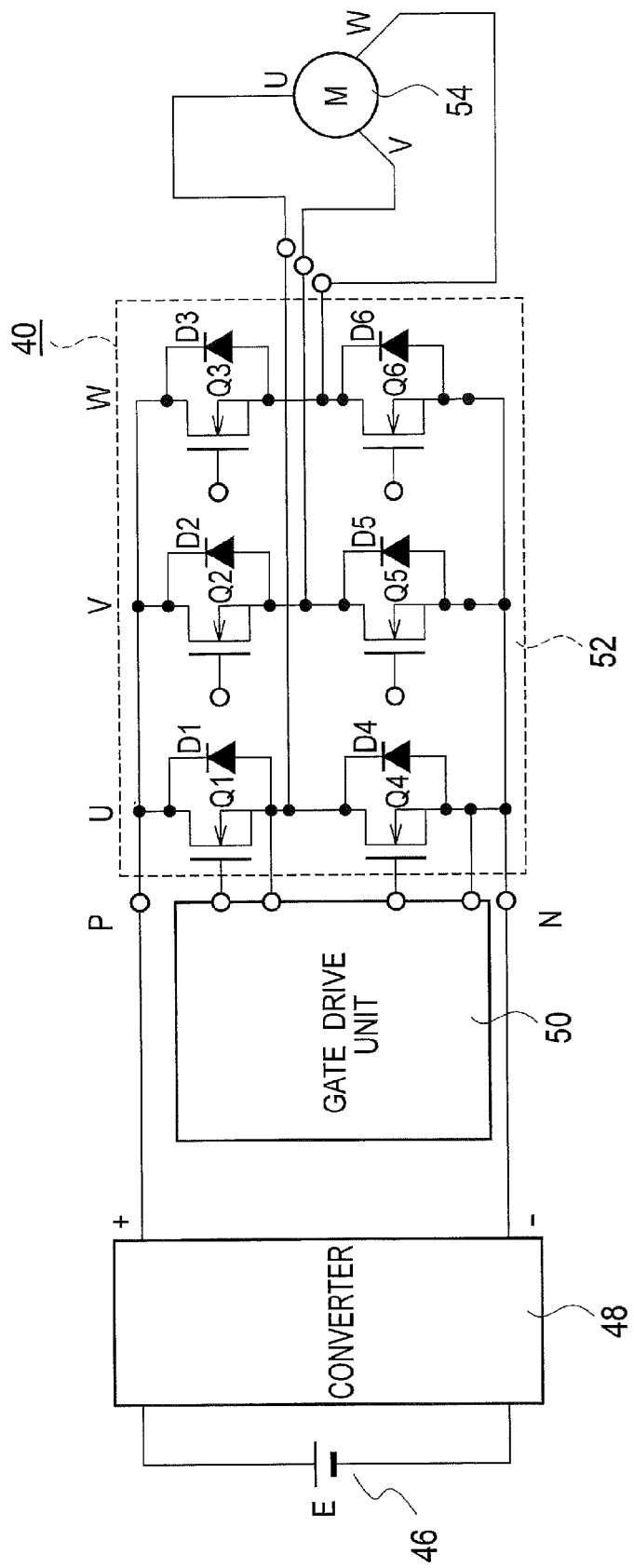
FIG. 19 is a schematic circuit configuration diagram of the three-phase AC inverter composed using the power module according to the embodiment.

As shown in FIG. 19, the three-phase AC inverter 40 includes: a gate drive unit 50; a power module unit 52 connected to the gate drive unit 50 and a three-phase AC motor unit 54. U-phase, V-phase, and W-phase inverters are respectively connected to the three-phase AC motor unit 54 so as to correspond to U phase, V phase, and W phase of the three-phase AC motor unit 54, in the power module unit 52. In this case, although the gate drive unit 50 is connected to the SiC MOSFETs Q1, Q4 as shown in FIG. 19, the gate drive unit 50 is similarly connected also to the SiC MOSFETs Q2, Q5 and the SiC MOSFETs Q3, Q6 (not shown in FIG. 19).

In the power module unit 52, the SiC MOSFETs Q1, Q4, and Q2, Q5, and Q3, Q6 having inverter configurations are connected between a positive terminal (+) and a negative terminal (−) to which the converter 48 in a storage battery (E) 46 is connected. Furthermore, diodes D1-D6 are connected inversely in parallel to one another between the source and the drain of the SiC-MOSFETs Q1 to Q6.

Although the structure of the single phase inverter corresponding to U phase portion of FIG. 19 has been explained in the power module 20 according to the embodiment, the three-phase power module unit 52 can also be formed also by similarly forming V phase and W phase inverters.

The power module according to the embodiment can be formed as any one selected from the group consist of 1-in-1 module, 2-in-1 module, 4-in-1 module, and 6-in-1 module.

As explained above, according to the embodiment, there can be provided the power module with improved cooling capability and improved reliability, and the fabrication method for such a power module.

[Other Embodiments]

As explained above, the embodiment has been described, as a disclosure including associated description and drawings to be construed as illustrative, not restrictive. This disclosure makes clear a variety of alternative embodiment, working examples, and operational techniques for those skilled in the art.

Such being the case, the embodiment covers a variety of embodiments, whether described or not. Although the relatively-soft insulating layer 7b is formed also between the leadframes 1 and 5 in FIGS. 5 and 11, the relatively-soft insulating layer 7b may not always be formed between the leadframes 1 and 5, but may be formed only on a bottom surface of the leadframes 1 and 5 (the relatively-hard insulating layer 7a).

INDUSTRIAL APPLICABILITY

The power module according to the embodiment can be used for semiconductor modules, e.g. IGBT modules, diode modules, MOS modules (Si, SiC, GaN), etc. The power module according to the embodiment can also be used for structures which do not use insulating substrates, e.g. Direct Copper Bond (DBC) incase type modules.

What is claimed is:

1. A power module comprising:
   an insulating layer;
   a metal layer disposed on the insulating layer;
   a semiconductor chip disposed on the metal layer; and
   a mold resin formed so as to cover the semiconductor chip, at least a part of the metal layer, and at least a part of the insulating layer, wherein
   the insulating layer includes a relatively-hard insulating layer disposed at a side of the metal layer and a relatively-soft insulating layer disposed at an opposite side of the metal layer.

2. The power module according to claim 1, wherein the relatively-soft insulating layer deforms so as to be adhered to a cooling body, the cooling body composed of a metal for radiating heat produced from the semiconductor chip.

3. The power module according to claim 1, wherein a hardness of the relatively-soft insulating layer is softer than A40 in durometer hardness.

4. The power module according to claim 1, wherein the relatively-soft insulating layer is formed of an organic material.

5. The power module according to claim 1, wherein
the relatively-soft insulating layer is formed of a silicone based resin.

6. The power module according to claim 1, wherein
the relatively-soft insulating layer is filled up with a high thermally-conductive filler.

7. The power module according to claim 6, wherein
the filler is at least one selected from the group consist of aluminium oxide, silicon oxide, aluminum nitride, silicon nitride, boron nitride, beryllia, and magnesia.

8. The power module according to claim 1, wherein
a hardness of the relatively-hard insulating layer is harder than A40 in durometer hardness.

9. The power module according to claim 1, wherein
the relatively-hard insulating layer is formed of an organic material.

10. The power module according to claim 1, wherein
the relatively-hard insulating layer is formed of at least one selected from the group consist of an epoxy based resin, an urethane system resin, an acrylic resin, and a silicone based resin.

11. The power module according to claim 1, wherein
the relatively-hard insulating layer is filled up with a high thermally-conductive filler.

12. The power module according to claim 11, wherein
the filler is at least one selected from the group consist of aluminium oxide, silicon oxide, aluminum nitride, silicon nitride, boron nitride, beryllia, and magnesia.

13. The power module according to claim 1, wherein
a groove into which a part of the relatively-hard insulating layer is inserted is formed on a surface of the metal layer facing the relatively-hard insulating layer, the surface of the metal layer on which the groove is formed is a region not opposite to the semiconductor chip.

14. The power module according to claim 1, wherein
the relatively-hard insulating layer is formed so as to cover a bottom surface and a corner portion of the metal layer, and the mold resin is formed so as to cover at least a side surface of the relatively-hard insulating layer.

15. The power module according to claim 14, wherein
an edge part of the relatively-soft insulating layer and an edge part of the relatively-hard insulating layer are intervened between the mold resin and the metal layer.

16. The power module according to claim 1, wherein
the mold resin is formed so as to cover a side surface of the metal layer, and the relatively-soft insulating layer is formed so as to cover a bottom surface of the metal layer and a bottom surface of the mold resin.

17. The power module according to claim 16, wherein
the semiconductor chip is formed of one selected from the group consist of an SiC based power device, a GaN based power device, and an AlN based power device; and
a current change rate di/dt thereof is larger than $3 \times 10^8$ (A/s).

18. The power module according to claim 1, wherein
the power module is formed as any one selected from the group consist of 1-in-1 module, 2-in-1 module, 4-in-1 module, and 6-in-1 module.

19. A fabrication method for a power module comprising:
bonding a semiconductor chip to a leadframe with a conductive bonding material;
electrically connecting the semiconductor chip and the leadframe to each other using a connecting member;
disposing the leadframe on a metallic mold, and then forming a relatively-hard insulating layer on a bottom surface of the leadframe so as to cover a bottom surface and a corner portion of the leadframe;
after curing the relatively-hard insulating layer, forming a relatively-soft insulating layer on the bottom surface of the relatively-hard insulating layer; and
after curing the relatively-soft insulating layer, closing the metallic mold, and then pouring a mold resin therein in order to mold the leadframe, the conductive bonding material, the semiconductor chip, and the connecting member.

20. A fabrication method for a power module comprising:
bonding a semiconductor chip to a leadframe with a conductive bonding material;
electrically connecting the semiconductor chip and the leadframe to each other using a connecting member;
disposing the leadframe on a metallic mold, then closing the metallic mold, then pouring a mold resin therein, and then molding of the leadframe, the conductive bonding material, the semiconductor chip, and the connecting member so that a bottom surface of the mold resin and a bottom surface of the leadframe are flush with each other;
forming a relatively-hard insulating layer on the surface of the mold resin and the surface of the leadframe which are flush with each other; and
forming a relatively-soft insulating layer on a surface of the relatively-hard insulating layer.

21. The fabrication method for a power module according to claim 19, wherein
the relatively-soft insulating layer is formed so that a corner portion of the relatively-hard insulating layer.

* * * * *